US011381223B2

(12) United States Patent
Usami et al.

(10) Patent No.: US 11,381,223 B2
(45) Date of Patent: Jul. 5, 2022

(54) POWER SUPPLY SYSTEM

(71) Applicant: TOYOTA JIDOSHA KABUSHIKI KAISHA, Toyota (JP)

(72) Inventors: Tomohiro Usami, Toyota (JP); Takuya Yamamoto, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 679 days.

(21) Appl. No.: 16/110,405

(22) Filed: Aug. 23, 2018

(65) Prior Publication Data
US 2019/0070973 A1 Mar. 7, 2019

(30) Foreign Application Priority Data

Sep. 4, 2017 (JP) ............................. JP2017-169475

(51) Int. Cl.
*H03K 3/017* (2006.01)
*B60L 58/12* (2019.01)
*H02M 3/158* (2006.01)
*B60L 58/13* (2019.01)
*B60L 58/20* (2019.01)
(Continued)

(52) U.S. Cl.
CPC ................ *H03K 3/017* (2013.01); *B60L 7/16* (2013.01); *B60L 58/12* (2019.02); *B60L 58/13* (2019.02); *B60L 58/18* (2019.02); *B60L 58/20* (2019.02); *H02J 7/34* (2013.01); *H02J 7/342* (2020.01); *H02M 3/158* (2013.01); *B60L 2210/10* (2013.01); *H02J 1/082* (2020.01); *H02J 7/0086* (2013.01)

(58) Field of Classification Search
CPC .......................... H02J 7/00304; H02J 7/00306
See application file for complete search history.

(56) References Cited

U.S. PATENT DOCUMENTS 6,198,259 B1 * 3/2001 Ueki .................... H02M 3/1563
323/224
2006/0006850 A1 1/2006 Inoue et al.
(Continued)

FOREIGN PATENT DOCUMENTS

CN 100438259 C 11/2008
JP 2000-354363 A 12/2000
(Continued)

*Primary Examiner* — Drew A Dunn
*Assistant Examiner* — Tynese V McDaniel
(74) *Attorney, Agent, or Firm* — Oliff PLC

(57) ABSTRACT

A power supply system includes: a first power storage device; a second power storage device having a lower voltage than the first power storage device; a DC-DC converter including a choke coil, a first switching element, a diode connected in parallel with the first switching element, and a second switching element; a semiconductor relay configured to switch a connection state between a second end of the choke coil and the second power storage device; and a controller configured to perform PWM control of the first switching element and the second switching element to control ON and OFF of the semiconductor relay. When an ON time of the second switching element is controlled to become zero and a current flowing out from the second power storage device exceeds a first reference current, the controller reduces a duty ratio of an ON time of the first switching element.

14 Claims, 9 Drawing Sheets

(51) Int. Cl.
*B60L 58/18* (2019.01)
*B60L 7/16* (2006.01)
*H02J 7/34* (2006.01)
*H02J 1/08* (2006.01)
*H02J 7/00* (2006.01)

(56) References Cited

U.S. PATENT DOCUMENTS

| | | | | |
|---|---|---|---|---|
| 2013/0320932 | A1* | 12/2013 | Zhou | H02J 7/00 |
| | | | | 320/136 |
| 2014/0281591 | A1* | 9/2014 | Uan-Zo-Li | G06F 1/263 |
| | | | | 713/300 |
| 2014/0300179 | A1 | 10/2014 | Ubukata et al. | |
| 2016/0064986 | A1* | 3/2016 | Langlinais | H02J 7/0068 |
| | | | | 320/134 |
| 2016/0164283 | A1* | 6/2016 | Zhao | H02M 3/1582 |
| | | | | 307/31 |
| 2016/0268816 | A1* | 9/2016 | Mao | H02J 7/0068 |
| 2016/0288660 | A1* | 10/2016 | Yang | B60L 53/20 |
| 2017/0141775 | A1* | 5/2017 | Caggegi | H03K 17/04123 |
| 2018/0090945 | A1* | 3/2018 | Langlinais | H02J 7/007 |
| 2018/0115025 | A1* | 4/2018 | Huang | H02J 7/008 |

FOREIGN PATENT DOCUMENTS

| | | |
|---|---|---|
| JP | 3391329 B2 | 3/2003 |
| JP | 2014-204625 A | 10/2014 |
| JP | 2015-220815 A | 12/2015 |
| WO | 2005/013455 A1 | 2/2005 |

\* cited by examiner

POWER SUPPLY SYSTEM

INCORPORATION BY REFERENCE

The disclosure of Japanese Patent Application No. 2017-169475 filed on Sep. 4, 2017 including the specification, drawings and abstract is incorporated herein by reference in its entirety.

BACKGROUND

1. Technical Field

The present disclosure relates to a power supply system including a DC-DC converter.

2. Description of Related Art

For example, Japanese Unexamined Patent Application Publication No. 2000-354363 (JP 2000-354363 A) discloses a power supply system in which a high voltage power storage device and a low voltage power storage device are connected to each other through a step-up and step-down type DC-DC converter so that charging of electric power from the high voltage side to the low voltage side and discharging of electric power from the low voltage side to the high voltage side are possible.

SUMMARY

In the power supply system disclosed in JP 2000-354363 A, in a case where it is detected that the voltage on the high voltage side of the DC-DC converter is lower than the voltage of the low voltage power storage device, the low voltage power storage device is disconnected from the DC-DC converter by a switch mechanism, such as a relay, to suppress overdischarge of the low voltage power storage device. For this reason, in the power supply system, in a case where the voltage on the high voltage side of the DC-DC converter becomes lower than the voltage of the low voltage power storage device, it is not possible to control and supply a current flowing from the low voltage power storage device by the DC-DC converter.

The disclosure provides a power supply system capable of controlling a current flowing from a low voltage power storage device in a predetermined voltage difference range even in a case where a voltage on a high voltage side of a DC-DC converter is lower than the voltage of the low voltage power storage device.

A first aspect of the disclosure relates to a power supply system including a first power storage device, a second power storage device, a DC-DC converter, a semiconductor relay, and a controller. The second power storage device has a lower voltage than the first power storage device. The DC-DC converter includes a choke coil, a first switching element configured to switch a connection state between a first end of the choke coil and the first power storage device, a first diode that is connected in parallel with the first switching element and that rectifies a current flowing from the choke coil side to the first power storage device side, and a second switching element configured to switch a ground state of the first end of the choke coil. The semiconductor relay switches a connection state between a second end of the choke coil and the second power storage device. The controller is configured to perform pulse width modulation (PWM) control of the first switching element and the second switching element to control ON and OFF of the semiconductor relay. The controller is configured to reduce a duty ratio of an ON time of the first switching element when an ON time of the second switching element is controlled to become zero and a current flowing out from the second power storage device exceeds a first reference current.

In the power supply system according to the first aspect of the disclosure, the controller may be configured to turn off the first switching element in a case where the ON time of the second switching element is controlled to become zero and the current flowing out from the second power storage device exceeds the first reference current.

By the control to lower the duty ratio of the ON time of the first switching element or turn off the first switching element, a voltage drop occurs due to the first diode connected in parallel with the first switching element. As a result, the voltage at the first end of the choke coil rises by the voltage corresponding to the voltage drop with respect to the voltage on the first power storage device side of the DC-DC converter. As described above, in a case where the voltage difference between the voltage on the first power storage device side of the DC-DC converter and the voltage of the second power storage device is within the range of the drop voltage due to the first diode, the current flowing out from the second power storage device can be appropriately controlled and supplied by the second switching element.

In the power supply system according to the first aspect of the disclosure, the semiconductor relay may include a third switching element and a fourth switching element connected in series to each other, a third diode that is connected in parallel with the third switching element and that rectifies a current flowing from the fourth switching element side to the choke coil side, and a fourth diode that is connected in parallel with the fourth switching element and that rectifies a current flowing from the third switching element side to the second power storage device side. The controller may be configured to reduce a duty ratio of an ON time of the third switching element or configured to further turn off the third switching element in a case where the ON time of the second switching element is controlled to become zero in a state in which the first switching element is turned off and the current flowing out from the second power storage device exceeds a second reference current.

By the control to lower the duty ratio of the ON time of the second switching element or turn off the third switching element, a voltage drop occurs due to the third diode connected in parallel with the third switching element. As a result, the voltage of the second power storage device rises by the voltage corresponding to the voltage drop with respect to the voltage of the second end of the choke coil. As described above, in a case where the voltage difference between the voltage on the first power storage device side of the DC-DC converter and the voltage of the second power storage device is also within the range of the drop voltage due to the third diode, the current flowing out from the second power storage device can be controlled by the second switching element.

In the power supply system according to the first aspect of the disclosure, the controller may be configured to further turn off the second switching element and the fourth switching element in a case where the ON time of the second switching element is controlled to become zero and the current flowing out from the second power storage device exceeds a third reference current.

Since all of the first to fourth switching elements are turned off by the above control, it is possible to suppress a situation in which a current flows out continuously from the second power storage device to the first power storage device side to cause overdischarge of the second power storage device.

In the power supply system according to the first aspect of the disclosure, each of the first reference current to the third reference current may be a value obtained by adding a predetermined value to a target current determined based on a state of charge (SOC) of the second power storage device.

Each of the first reference current to the third reference current can be a value obtained by adding a predetermined value to a target current determined based on the state of charge SOC of the second power storage device. Chattering of transition control can be suppressed by adding the predetermined value.

In the power supply system according to the first aspect of the disclosure, the controller may be configured to turn off the first switching element, the second switching element, the third switching element, and the fourth switching element in a case where the current flowing out from the second power storage device exceeds a fourth reference current.

In the power supply system according to the first aspect of the disclosure, the fourth reference current may be a value obtained by adding a predetermined value set to suppress chattering to a target current determined based on a state of charge SOC of the second power storage device.

A second aspect of the disclosure relates to a power supply system including a first power storage device, a second power storage device, a DC-DC converter, a semiconductor relay, and a controller. The second power storage device has a lower voltage than the first power storage device. The DC-DC converter includes a choke coil, a first switching element configured to switch a connection state between a first end of the choke coil and the first power storage device, a first diode that is connected in parallel with the first switching element and that rectifies a current flowing from the choke coil side to the first power storage device side, and a second switching element configured to switch a ground state of the first end of the choke coil. The semiconductor relay switches a connection state between a second end of the choke coil and the second power storage device. The controller is configured to perform PWM control of the first switching element and the second switching element to control ON and OFF of the semiconductor relay. The controller may be configured to reduce a duty ratio of an ON time of the first switching element or configured to turn off the first switching element in a case where a voltage on the first power storage device side becomes lower than a voltage of the second power storage device.

As in the power supply system according to the second aspect of the disclosure, by the control to lower the duty ratio of the ON time of the first switching element or turn off the first switching element in a case where the voltage on the first power storage device side becomes lower than the voltage of the second power storage device, a voltage drop occurs due to the first diode connected in parallel with the first switching element. As a result, the voltage at the first end of the choke coil rises by the voltage corresponding to the voltage drop with respect to the voltage on the first power storage device side of the DC-DC converter. Therefore, in a case where the voltage difference between the voltage on the first power storage device side of the DC-DC converter and the voltage of the second power storage device is within the range of the drop voltage due to the first diode, the current flowing out from the second power storage device can be controlled by the second switching element.

In the power supply system according to the second aspect of the disclosure, the semiconductor relay may include a third switching element and a fourth switching element connected in series to each other, a third diode that is connected in parallel with the third switching element and that rectifies a current flowing from the fourth switching element side to the choke coil side, and a fourth diode that is connected in parallel with the fourth switching element and that rectifies a current flowing from the third switching element side to the second power storage device side. The controller may be configured to reduce a duty ratio of an ON time of the third switching element or configured to further turn off the third switching element in a case where the voltage on the first power storage device side becomes lower than a first voltage, which is lower than the voltage of the second power storage device by a predetermined value, in a state in which the first switching element is turned off.

By the control to lower the duty ratio of the ON time of the third switching element or turn off the third switching element, a voltage drop occurs due to the third diode connected in parallel with the third switching element. As a result, the voltage of the second power storage device rises by the voltage corresponding to the voltage drop with respect to the voltage of the second end of the choke coil. Therefore, in a case where the voltage difference between the voltage on the first power storage device side of the DC-DC converter and the voltage of the second power storage device is also within the range of the drop voltage due to the third diode, the current flowing out from the second power storage device can be controlled by the second switching element.

In the power supply system according to the second aspect of the disclosure, the controller may be configured to further turn off the second switching element and the fourth switching element in a case where the voltage on the first power storage device side becomes lower than a second voltage that is lower than the voltage of the second power storage device by a predetermined value. In the power supply system according to the second aspect of the disclosure, the predetermined value may be set based on a drop voltage of the first diode and the third diode.

Since all of the first to fourth switching elements are turned off by the above control, it is possible to suppress a situation in which a current flows out continuously from the second power storage device to the first power storage device side to cause overdischarge of the second power storage device.

With the power supply system of the aspect of the disclosure, even in a case where the voltage on the high voltage side of the DC-DC converter is lower than the voltage of the low voltage power storage device, it is possible to control the current flowing from the low voltage power storage device in a predetermined voltage difference range.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Outline

In a power supply system of the disclosure, in a case where the voltage on the high voltage side becomes lower than the voltage on the low voltage side and accordingly the DC-DC converter cannot control the current while the DC-DC converter is being used in a discharge mode, a switching element is controlled to be turned off to cause a voltage drop due to a diode connected in parallel with the switching element. As described above, since the voltage drop width allowed for the high voltage side as viewed from the low voltage side substantially increases, the DC-DC converter can control the current in a predetermined voltage difference range.

Configuration of Power Supply System

Figure 1:
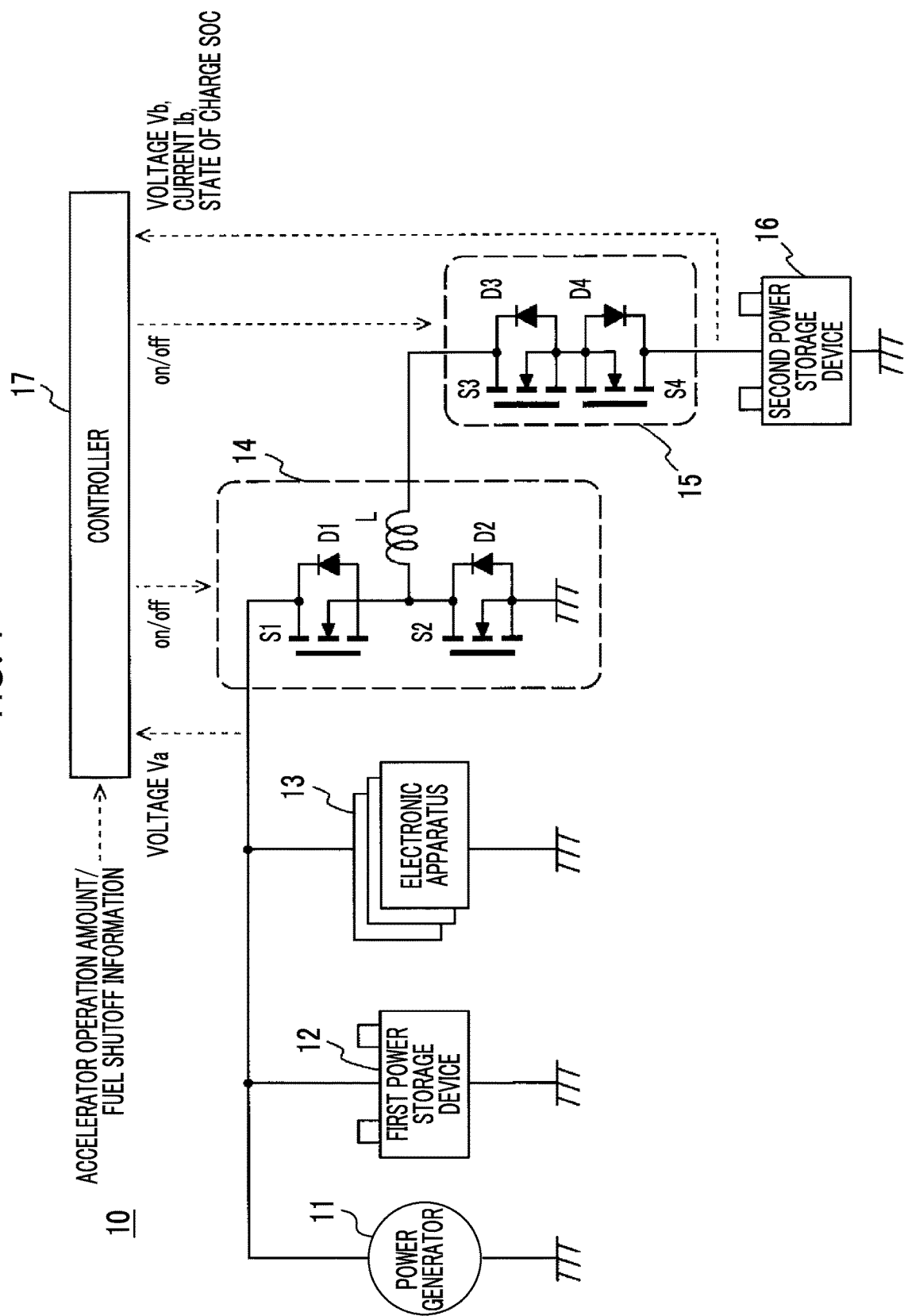
FIG. 1 is a diagram showing the schematic configuration of a power supply system according to an embodiment of the disclosure.

FIG. 1 is a diagram showing the schematic configuration of a power supply system 10 according to an embodiment of the disclosure. The power supply system 10 illustrated in FIG. 1 includes a power generator 11, a first power storage device 12, an electronic apparatus 13, a DC-DC converter 14, a semiconductor relay 15, a second power storage device 16, and a controller 17. The power supply system 10 according to the present embodiment can be mounted in a vehicle, such as a hybrid vehicle or an electric vehicle, for example.

The power generator 11 is, for example, an alternator, and is a device that generates electric power at the time of decelerating the vehicle or traveling downhill. The power generator 11 is connected to each of the first power storage device 12, the electronic apparatus 13, and the DC-DC converter 14, and can convert regenerative energy generated during traveling of the vehicle into electric power and supply the electric power to the above-described configuration.

The first power storage device 12 is, for example, a power storage element configured to be chargeable and dischargeable, such as a lead storage battery. The first power storage device 12 is connected to the power generator 11, the electronic apparatus 13, and the DC-DC converter 14, and stores electric power generated by the power generator 11 or discharges electric power stored therein to the electronic apparatus 13 or the DC-DC converter 14. A power storage device having a predetermined voltage (for example, 48 V) is used as the first power storage device 12.

The electronic apparatus 13 is an apparatus that becomes a load that consumes electric power. One or a plurality of electronic apparatuses 13 may be used. The electronic apparatus 13 is connected to the power generator 11, the first power storage device 12, and the DC-DC converter 14, and is configured so as to be operable with electric power generated by the power generator 11, electric power stored in the first power storage device 12, or electric power supplied from the second power storage device 16 through the DC-DC converter 14.

The DC-DC converter 14 is a voltage converter that converts the input voltage into a predetermined voltage and outputs the voltage. In the DC-DC converter 14, the primary side is connected to the power generator 11, the first power storage device 12, and the electronic apparatus 13, and the secondary side is connected to the semiconductor relay 15. For example, the DC-DC converter 14 can be a bidirectional voltage converter having both a step-down function of lowering the high voltage on the primary side and outputting the lowered voltage to the secondary side and a step-up function of boosting the low voltage on the secondary side and outputting the boosted voltage to the primary side.

The DC-DC converter 14 illustrated in FIG. 1 is a non-insulated step-up and step-down type bi-directional DC-DC converter, and includes a choke coil L, a first switching element S1 configured to switch a connection state between a first end of the choke coil L and the first power storage device 12, a first diode D1 connected in parallel with the first switching element S1, a second switching element S2 configured to switch the ground state of the first end of the choke coil L, and a second diode D2 connected in parallel with the second switching element S2. The first diode D1 and the second diode D2 are connected so as to perform rectification in the direction of the first power storage device 12. The first switching element S1 and the second switching element S2 are configured such that the state of the ON or OFF operation can be switched under the control of the controller 17 to be described later.

The semiconductor relay 15 includes a third switching element S3, a third diode D3 connected in parallel with the third switching element S3, a fourth switching element S4 connected in series to the third switching element S3, and a fourth diode D4 connected in parallel with the fourth switching element S4. In the example shown in FIG. 1, in the semiconductor relay 15, the third switching element S3 is connected to a second end (secondary side) of the choke coil L of the DC-DC converter 14, and the fourth switching element S4 is connected to the second power storage device 16. The third diode D3 is connected so as to perform rectification in the direction of the choke coil L. Contrary to the third diode D3, the fourth diode D4 is connected so as to perform rectification in the direction of the second power storage device 16. The third switching element S3 and the fourth switching element S4 are configured such that the state of ON or OFF operation can be switched under the control of the controller 17 to be described later.

As a parallel connection configuration of the first switching element S1 and the first diode D1, a parallel connection configuration of the second switching element S2 and the second diode D2, a parallel connection configuration of the third switching element S3 and the third diode D3, and a parallel connection configuration of the fourth switching element S4 and the fourth diode D4, a field effect transistor (FET) in which a body diode is formed between a source and a drain and the like can be used.

The second power storage device 16 is, for example, a power storage element configured to be chargeable and dischargeable, such as a lithium ion battery. The second power storage device 16 is connected to the semiconductor relay 15. Through the semiconductor relay 15, electric power generated by the power generator 11 is stored after being converted by the DC-DC converter 14, or electric power stored in the second power storage device 16 is converted by the DC-DC converter 14 and discharged (supplied) to the electronic apparatus 13. A power storage device having a voltage (for example, 12 V) lower than the voltage (48 V) of the first power storage device 12 is used as the second power storage device 16.

The controller 17 acquires a voltage Va on the primary side of the DC-DC converter 14 and a voltage Vb, a (inflow or outflow) current Ib, and a state of charge SOC of the second power storage device 16. The controller 17 acquires operation amount information regarding ON/OFF of an accelerator and fuel information regarding injection/shutoff of fuel to the internal combustion engine from a vehicle apparatus (not shown). Then, the controller 17 appropriately controls the state of the ON or OFF operation of the first switching element S1 and the second switching element S2 of the DC-DC converter 14 and the third switching element S3 and the fourth switching element S4 of the semiconductor relay 15 based on the voltage Va on the primary side of the DC-DC converter 14, the voltage Vb, the current Ib, and the state of charge SOC of the second power storage device 16, the operation amount information, and the fuel information that have been acquired. A control method of the controller 17 will be described later.

State Transition of Power Supply System

Figure 2:
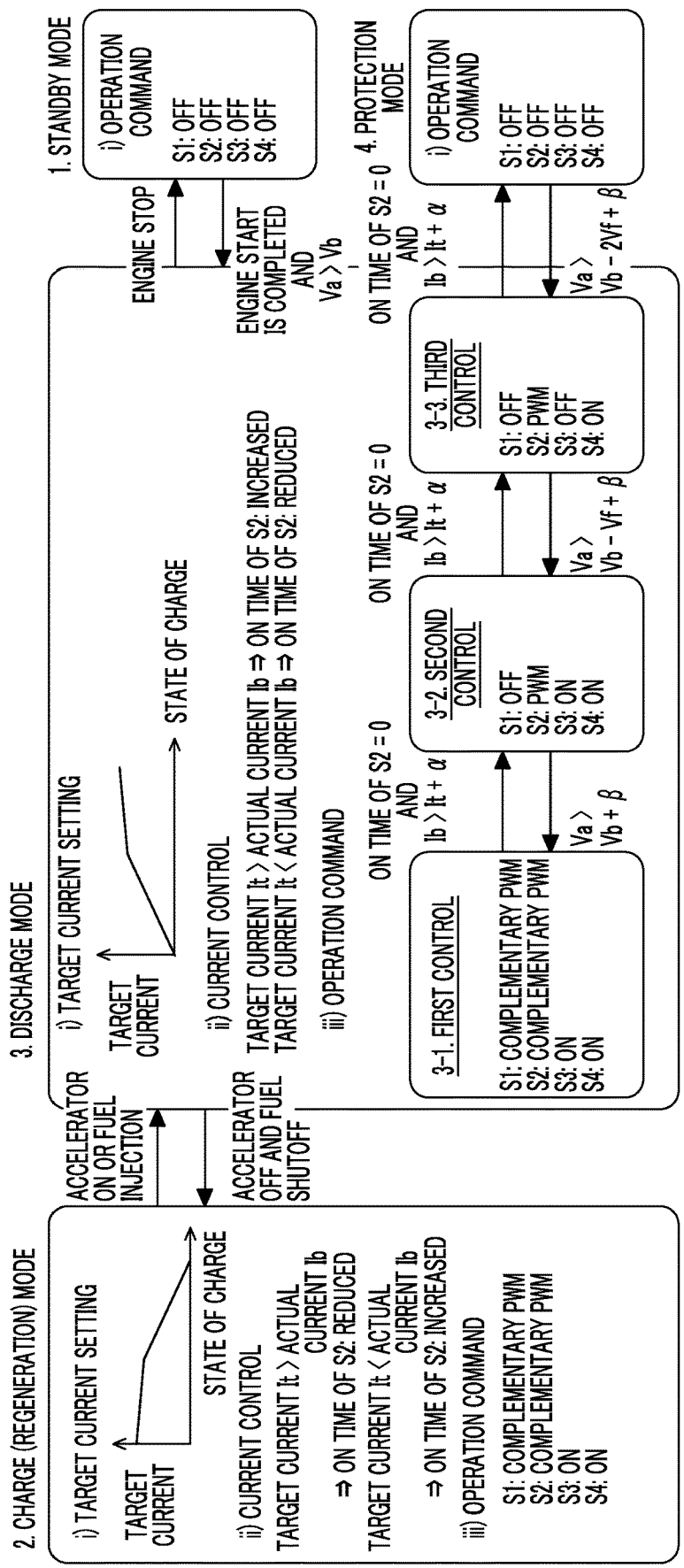
FIG. 2 is a state transition diagram of the power supply system according to the embodiment of the disclosure.

FIG. 2 is a state transition diagram of the power supply system 10 according to the embodiment of the disclosure. As shown in FIG. 2, the power supply system 10 has a standby mode, a charge (regeneration) mode, a discharge mode, and a protection mode as transitionable states.

1. Standby Mode

The standby mode is a mode in a case where the engine is stopped, such as a case where the vehicle is not being used (for example, during parking). In the standby mode, in preparation for a case (Va<<Vb) where the voltage Va on the primary side of the DC-DC converter 14 is significantly lower than the voltage Vb of the second power storage device 16 due to a starter current generated at the time of engine start that can be subsequently operated, all of the first to fourth switching elements S1 to S4 are controlled to be turned off (OFF).

In the standby mode, in a case where engine start is completed and the voltage Va on the primary side of the DC-DC converter 14 becomes higher than the voltage Vb of the second power storage device 16 (Va>Vb), the state transitions from the standby mode to the discharge mode.

2. Charge (Regeneration) Mode

The charge (regeneration) mode is a mode for charging the second power storage device 16 with electric power. In the charge (regeneration) mode, regenerative electric power generated in the power generator 11 at the time of decelerating the vehicle or traveling downhill is converted by the DC-DC converter 14 to charge the second power storage device 16. In the charge (regeneration) mode, in order to increase the conversion efficiency by reducing the loss of the DC-DC converter 14, the first switching element S1 and the second switching element S2 perform a switching operation (complementary PWM) based on complementary PWM control. In the charge (regeneration) mode, the third switching element S3 and the fourth switching element S4 are turned on (ON).

A charge current to the second power storage device 16 is determined based on the state of charge SOC of the second power storage device 16. More specifically, the time (ON time) during which the second switching element S2 of the DC-DC converter 14 is turned on is controlled such that the current Ib (actual current) actually flowing into the second power storage device 16 becomes a target current It set from the state of charge SOC. For example, the controller 17 performs control to reduce the ON time of the second switching element S2 in a case where the actual current Ib is smaller than the target current It, and performs control to increase the ON time of the second switching element S2 in a case where the actual current Ib is larger than the target current It.

In the charge (regeneration) mode, in a case where the accelerator pedal is depressed even a little (accelerator ON) or fuel injection in the internal combustion engine is started, the state transitions from the charge (regeneration) mode to the discharge mode. That is, in a case where regenerative electric power is no longer generated in the power generator 11, the state is immediately switched from the charge (regeneration) mode to the discharge mode.

3. Discharge Mode

The discharge mode is a mode for discharging the second power storage device 16. In the discharge mode, the electric power stored in the second power storage device 16 is converted by the DC-DC converter 14 and discharged (supplied) to the electronic apparatus 13. In the discharge mode of the present embodiment, any one of first control, second control, and third control described below is executed according to the voltage Va on the primary side of the DC-DC converter 14 and the voltage Vb and the outflow current Ib of the second power storage device 16.

3-1. First Control of Discharge Mode

The first control of the discharge mode is a control that is executed first in a case where the state transitions from the standby mode or the charge (regeneration) mode to the discharge mode. In the first control, in order to increase the conversion efficiency by reducing the loss of the DC-DC converter 14, the first switching element S1 and the second switching element S2 perform a switching operation (complementary PWM) by complementary PWM control. In the first control, the third switching element S3 and the fourth switching element S4 are turned on (ON).

A discharge current from the second power storage device 16 is determined based on the state of charge SOC of the second power storage device 16. More specifically, the time (ON time) during which the second switching element S2 of the DC-DC converter 14 is turned on is controlled such that the current Ib (actual current) actually flowing out from the second power storage device 16 becomes the target current It set from the state of charge SOC. For example, the controller 17 performs control to increase the ON time of the second switching element S2 in a case where the actual current Ib is smaller than the target current It, and performs control to reduce the ON time of the second switching element S2 in a case where the actual current Ib is larger than the target current It.

In the first control of the discharge mode, in a case where the engine is stopped by ignition OFF or the like, the state transitions from the discharge mode to the standby mode. Alternatively, in the first control of the discharge mode, in a case where the driver's foot is separated from the accelerator pedal (accelerator OFF) or fuel supply to the internal combustion engine is stopped, the state transitions from the discharge mode to the charge (regeneration) mode.

Alternatively, in the first control of the discharge mode, in a case where the actual current Ib flowing out from the second power storage device 16 exceeds a predetermined reference current (first reference current) even though the controller 17 controls the ON time of the second switching element S2 to become zero, such as a case where the voltage Va on the primary side of the DC-DC converter 14 is lower than the voltage Vb of the second power storage device 16, in other words, in a case where the outflow current is likely to be uncontrollable by the second switching element S2, the control in the discharge mode transitions from the first control to the second control. The reference current can be a value (It+α) obtained by adding a predetermined value α for suppressing the chattering of transition control to the target current It.

3-2. Second Control of Discharge Mode

In the second control of the discharge mode, the first switching element S1 of the DC-DC converter 14 is turned off (OFF) in order to continuously control the outflow current that cannot be controlled in the first control. Due to the OFF operation of the first switching element S1, a voltage drop occurs due to the first diode D1 connected in parallel with the first switching element S1. As a result, the voltage at the first end of the choke coil L rises by a voltage Vf corresponding to the voltage drop with respect to the voltage Va on the primary side of the DC-DC converter 14.

Through the above control, the outflow current from the second power storage device 16, which cannot be controlled in the first control, can be controlled by the second switching element S2. Specifically, even in a case where the voltage Va on the primary side of the DC-DC converter 14 is further reduced, in a case where the range of the above-described reduced voltage is within the voltage Vf corresponding to the voltage drop, the current flowing out from the second power storage device 16 can be controlled by the second switching element S2. That is, by controlling the ON time of the second switching element S2 to become zero, the actual current Ib flowing out from the second power storage device 16 can be set to zero.

Also in the second control of the discharge mode, as in the first control, in a case where the engine is stopped by ignition OFF or the like, the state transitions from the discharge mode to the standby mode. Alternatively, in the second control of the discharge mode, in a case where the driver's foot is separated from the accelerator pedal (accelerator OFF) or fuel supply to the internal combustion engine is stopped, the state transitions from the discharge mode to the charge (regeneration) mode.

Alternatively, in the second control of the discharge mode, in a case where the drop in the voltage Va on the primary side of the DC-DC converter 14 is further continued and the actual current Ib flowing out from the second power storage device 16 exceeds a predetermined reference current (second reference current) again even though the controller 17 controls the ON time of the second switching element S2 to become zero, the control in the discharge mode transitions from the second control to the third control. The predetermined value α of the reference current determined in the second control may be different from the predetermined value α of the reference current determined in the first control.

On the other hand, in the second control of the discharge mode, in a case where the voltage Va on the primary side of the DC-DC converter 14 is restored and the voltage Va on the primary side of the DC-DC converter 14 exceeds a voltage value obtained by adding a predetermined value β to the voltage Vb of the second power storage device 16 (Va>Vb+β), the control in the discharge mode transitions from the second control to the first control. The predetermined value β can be freely set to suppress the chattering of the transition control.

3-3. Third Control of Discharge Mode

In the third control of the discharge mode, the third switching element S3 of the semiconductor relay 15 is turned off (OFF) in order to continuously control the outflow current that cannot be controlled in the second control. Due to the OFF operation of the third switching element S3, a voltage drop occurs due to the third diode D3 connected in parallel with the third switching element S3. As a result, the voltage Vb of the second power storage device 16 rises by the voltage Vf corresponding to the voltage drop with respect to the voltage of the second end of the choke coil L.

Through the above control, the outflow current from the second power storage device 16, which cannot be controlled in the second control, can be controlled by the second switching element S2. Specifically, even in a case where the voltage Va on the primary side of the DC-DC converter 14 is further reduced, in a case where the range of the above-described reduced voltage is within the voltage Vf corresponding to the voltage drop (from the state of the first control, within the voltage Vf corresponding to the voltage drop×2), the current flowing out from the second power storage device 16 can be controlled by the second switching element S2. That is, by controlling the ON time of the second switching element S2 to become zero, the actual current Ib flowing out from the second power storage device 16 can be set to zero.

Also in the third control of the discharge mode, as in the first control and the second control, in a case where the engine is stopped by ignition OFF or the like, the state transitions from the discharge mode to the standby mode. Alternatively, in the second control of the discharge mode, in a case where the driver's foot is separated from the accelerator pedal (accelerator OFF) or fuel supply to the internal combustion engine is stopped, the state transitions from the discharge mode to the charge (regeneration) mode.

Alternatively, in the third control of the discharge mode, in a case where the drop in the voltage Va on the primary side of the DC-DC converter 14 is further continued and the actual current Ib flowing out from the second power storage device 16 exceeds a predetermined reference current (third reference current) again even though the controller 17 controls the ON time of the second switching element S2 to become zero, the state transitions from the discharge mode to the protection mode. The predetermined value α of the reference current determined in the third control may be different from the predetermined value α of the reference current determined in the first control and the second control.

On the other hand, in the third control of the discharge mode, in a case where the voltage Va on the primary side of the DC-DC converter 14 is restored and the voltage Va on the primary side of the DC-DC converter 14 exceeds a voltage value obtained by subtracting the voltage Vf corresponding to the voltage drop from the voltage Vb of the second power storage device 16 and adding the predetermined value β (Va>Vb−Vf+β), the control in the discharge mode transitions from the third control to the second control. The predetermined value β determined in the third control may be different from the predetermined value β determined in the second control.

4. Protection Mode

The protection mode is a mode for protecting the second power storage device 16. In the protection mode, in order to suppress a situation in which a current flows out continuously from the second power storage device 16 to the electronic apparatus 13 side to cause overdischarge of the second power storage device 16, all of the first switching element S1 to the fourth switching element S4 Is controlled to be turned off (OFF).

In the protection mode, in a case where the voltage Va on the primary side of the DC-DC converter 14 is restored and the voltage Va on the primary side of the DC-DC converter 14 exceeds a voltage value obtained by subtracting twice the voltage Vf corresponding to the voltage drop from the voltage Vb of the second power storage device 16 and adding the predetermined value β (Va>Vb−2Vf+β), the state transitions from the protection mode to the third control of the discharge mode. The predetermined value β determined in the protection mode may be different from the predetermined value β determined in the second control and the third control.

Control Performed by Power Supply System

Figure 3:
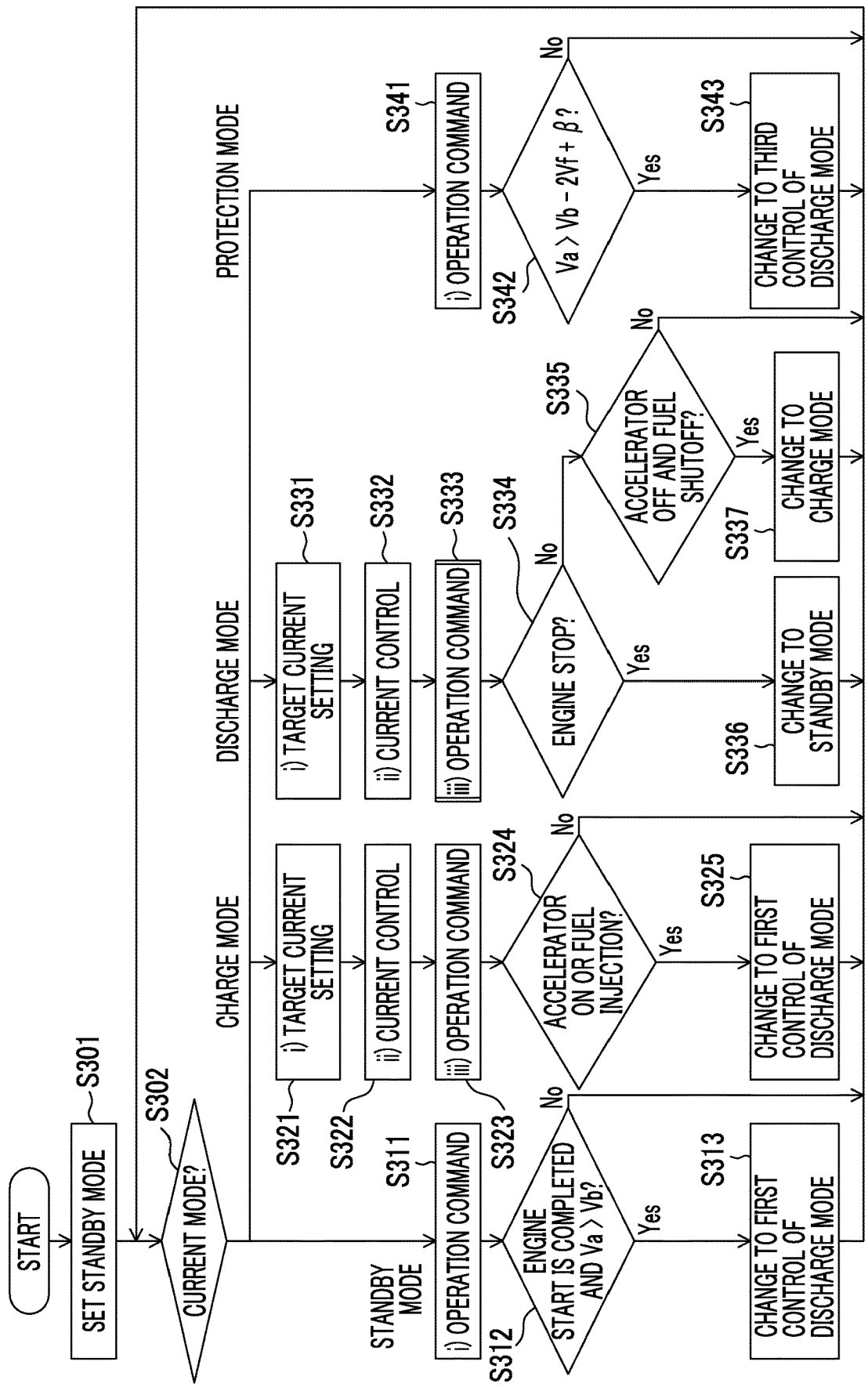
FIG. 3 is a flowchart of power supply control processing performed by a controller of the power supply system.
Figure 4:
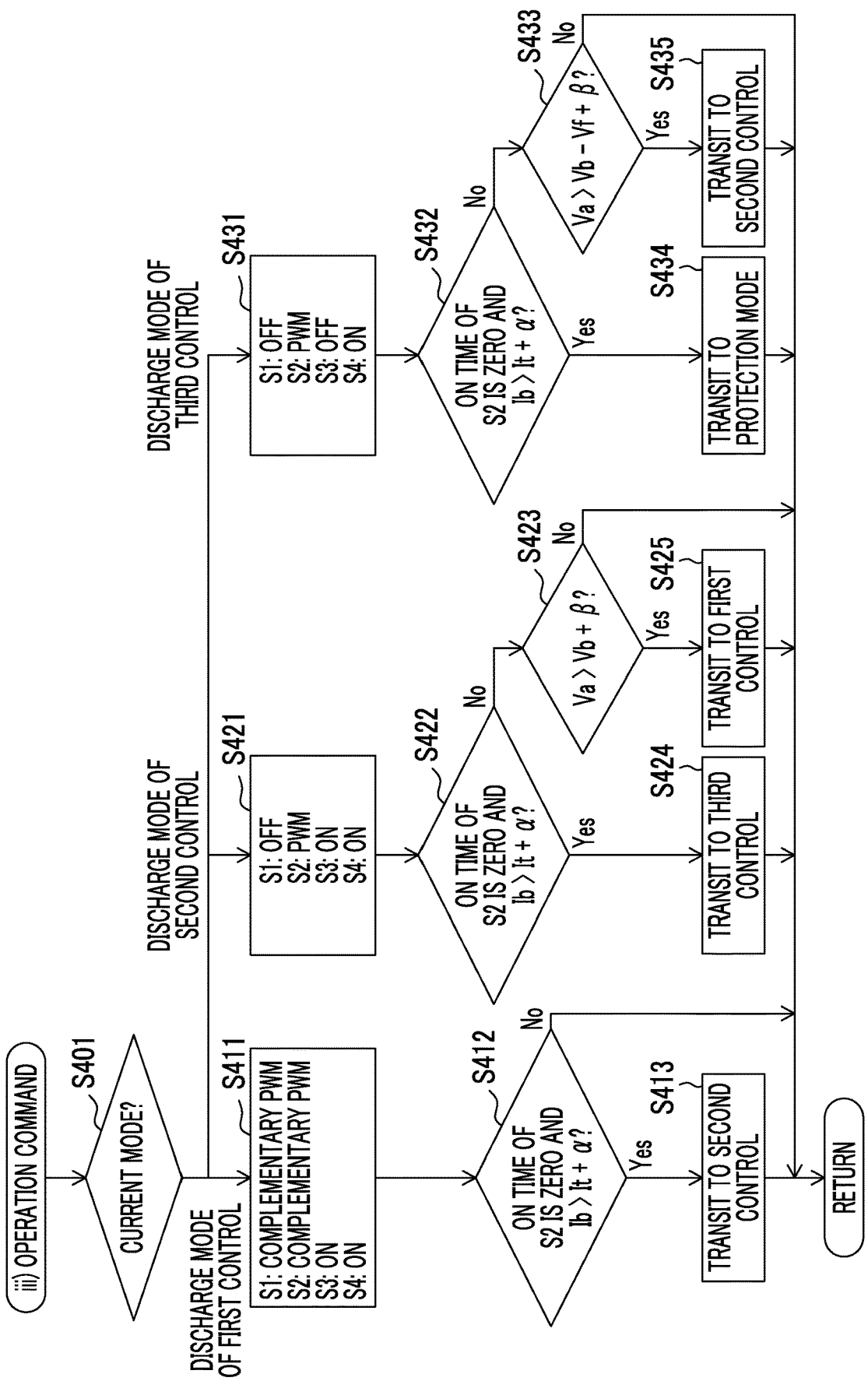
FIG. 4 is a flowchart of power supply control processing performed by the controller of the power supply system.

By further referring to FIGS. 3 and 4, power supply control performed by the power supply system 10 according to the embodiment of the disclosure will be described. FIGS. 3 and 4 are flowcharts illustrating the procedure of power supply control performed by the controller 17 of the power supply system 10.

Step S301: After a vehicle door is unlocked, the standby mode is set first as an initial state. In a case where the standby mode is set, the process proceeds to step S302.

Step S302: The current mode in the power supply system 10 is determined. The process proceeds to step S311 in a case where the current mode is a standby mode, proceeds to step S321 in a case where the current mode is a charge (regeneration) mode, proceeds to step S331 in a case where the current mode is a discharge mode, and proceeds to step S341 in a case where the current mode is a protection mode.

Step S311: (Standby mode) By the operation command from the controller 17, all of the first switching element S1 to the fourth switching element S4 are turned off. In a case where there is an operation command, the process proceeds to step S312.

Step S312: Whether or not the conditions, in which engine start is completed and the voltage Va on the primary side of the DC-DC converter 14 is higher than the voltage Vb of the second power storage device 16 (Va>Vb), are satisfied is determined. In a case where the conditions are satisfied (S312, Yes), the process proceeds to step S313. In a case where the conditions are not satisfied (S312, No), the process returns to step S302.

Step S313: The standby mode is changed to the first control of the discharge mode. In a case where the mode is changed, the process returns to step S302.

Step S321: (Charge mode) The target current It is set based on the state of charge SOC of the second power storage device 16. In a case where the target current It is set, the process proceeds to step S322.

Step S322: According to the set target current It, the actual current Ib flowing into the second power storage device 16 is controlled. In a case where the actual current Ib is controlled, the process proceeds to step S323.

Step S323: By the operation command from the controller 17, the first switching element S1 and the second switching element S2 are subjected to complementary PWM control, and the third switching element S3 and the fourth switching element S4 are turned on. In a case where there is an operation command, the process proceeds to step S324.

Step S324: Whether or not the conditions, in which the accelerator is ON or the fuel is being injected, are satisfied is determined. In a case where the conditions are satisfied (S324, Yes), the process proceeds to step S325. In a case where the conditions are not satisfied (S324, No), the process returns to step S302.

Step S325: The charge mode is changed to the first control of the discharge mode. In a case where the mode is changed, the process returns to step S302.

Step S331: (Discharge mode) The target current It is set based on the state of charge SOC of the second power storage device 16. In a case where the target current It is set, the process proceeds to step S332.

Step S332: According to the set target current It, the actual current Ib flowing out from the second power storage device 16 is controlled. In a case where the actual current Ib is controlled, the process proceeds to step S333.

Step S333: By the operation command from the controller 17, operations of the first switching element S1 to the fourth switching element S4 are controlled. In the above control, processes of steps S401 to S435 in FIG. 4 are performed.

Step S401: The current mode in the power supply system 10 is determined. The process proceeds to step S411 in a case where the current mode is the discharge mode of the first control, proceeds to step S421 in a case where the current mode is the discharge mode of the second control, and proceeds to step S431 in a case where the current mode is the discharge mode of the third control.

Step S411: (First control) By the operation command from the controller 17, the first switching element S1 and the second switching element S2 are subjected to complementary PWM control, and the third switching element S3 and the fourth switching element S4 are turned on (ON). In a case where there is an operation command, the process proceeds to step S412.

Step S412: Whether or not the conditions, in which the ON time of the second switching element S2 is zero and the actual current Ib exceeds a first reference current (It+α), are satisfied is determined. In a case where the conditions are satisfied (S412, Yes), the process proceeds to step S413. In a case where the conditions are not satisfied (S412, No), the process proceeds to step S334 in FIG. 3.

Step S413: The first control of the discharge mode transitions to the second control. In a case where the first control of the discharge mode transitions to the second control, the process proceeds to step S334 in FIG. 3.

Step S421: (Second control) By the operation command from the controller 17, the first switching element S1 is turned off (OFF), the second switching element S2 is subjected to PWM control, and the third switching element S3 and the fourth switching element S4 are turned on (ON). In a case where there is an operation command, the process proceeds to step S422.

Step S422: Whether or not the conditions, in which the ON time of the second switching element S2 is zero and the actual current Ib exceeds a second reference current (It+α), are satisfied is determined. In a case where the conditions are satisfied (S422, Yes), the process proceeds to step S424. In a case where the conditions are not satisfied (S422, No), the process proceeds to step S423.

Step S423: Whether or not the conditions, in which the voltage Va on the primary side of the DC-DC converter 14 is larger than a value obtained by adding the predetermined value β to the voltage Vb of the second power storage device 16 (Va>Vb+β), are satisfied is determined. In a case where the conditions are satisfied (S423, Yes), the process proceeds to step S425. In a case where the conditions are not satisfied (S423, No), the process proceeds to step S334 in FIG. 3.

Step S424: The second control of the discharge mode transitions to the third control. In a case where the second control of the discharge mode transitions to the third control, the process proceeds to step S334 in FIG. 3.

Step S425: The second control of the discharge mode transitions to the first control. In a case where the second control of the discharge mode transitions to the first control, the process proceeds to step S334 in FIG. 3.

Step S431: (Third control) By the operation command from the controller 17, the first switching element S1 and the third switching element S3 are turned off (OFF), the second switching element S2 is subjected to PWM control, and the fourth switching element S4 is turned on (ON). In a case where there is an operation command, the process proceeds to step S432.

Step S432: Whether or not the conditions, in which the ON time of the second switching element S2 is zero and the actual current Ib exceeds a third reference current (It+α), are satisfied is determined. In a case where the conditions are satisfied (S432, Yes), the process proceeds to step S434. In a case where the conditions are not satisfied (S432, No), the process proceeds to step S433.

Step S433: Whether or not the conditions, in which the voltage Va on the primary side of the DC-DC converter 14 is larger than a value obtained by subtracting the voltage Vf corresponding to the voltage drop from the voltage Vb of the second power storage device 16 and adding the predetermined value β (Va>Vb−Vf+β), are satisfied is determined. In a case where the conditions are satisfied (S433, Yes), the process proceeds to step S435. In a case where the conditions are not satisfied (S433, No), the process proceeds to step S334 in FIG. 3.

Step S434: The third control of the discharge mode is changed to the protection mode. In a case where the mode is changed, the process proceeds to step S334 in FIG. 3.

Step S435: The third control of the discharge mode transitions to the second control. In a case where the third control of the discharge mode transitions to the second control, the process proceeds to step S334 in FIG. 3.

Step S334: Whether or not the conditions in which the engine is stopped are satisfied is determined. In a case where the conditions are satisfied (S334, Yes), the process proceeds to step S336. In a case where the conditions are not satisfied (S334, No), the process proceeds to step S335.

Step S335: Whether or not the conditions, in which the accelerator is OFF and the fuel is shut off, are satisfied is determined. In a case where the conditions are satisfied (S335, Yes), the process proceeds to step S337. In a case where the conditions are not satisfied (S335, No), the process returns to step S302.

Step S336: The discharge mode is changed to the standby mode. In a case where the mode is changed, the process returns to step S302.

Step S337: The discharge mode is changed to the charge mode. In a case where the mode is changed, the process returns to step S302.

Step S341: (Protection mode) By the operation command from the controller 17, all of the first switching element S1 to the fourth switching element S4 are turned off (OFF). In a case where there is an operation command, the process proceeds to step S342.

Step S342: Whether or not the conditions, in which the voltage Va on the primary side of the DC-DC converter 14 is larger than a value obtained by subtracting twice the voltage Vf corresponding to the voltage drop from the voltage Vb of the second power storage device 16 and adding the predetermined value β (Va>Vb−2Vf+β), are satisfied is determined. In a case where the conditions are satisfied (S342, Yes), the process proceeds to step S343. In a case where the conditions are not satisfied (S342, No), the process returns to step S302.

Step S443: The protection mode is changed to the third control of the discharge mode. In a case where the mode is changed, the process returns to step S302.

Operations and Effects in the Present Embodiment

According to the power supply system 10 according to the embodiment of the disclosure described above, while the DC-DC converter 14 is being used in the discharge mode, in a case where the current flowing out from the second power storage device 16 cannot be controlled even though the ON time of the second switching element S2 is controlled to become zero and the actual current Ib that flows out exceeds a reference current "target current It+predetermined value α", the controller 17 turns off the first switching element S1 (OFF).

By turning off the first switching element S1, a voltage drop occurs due to the first diode D1 connected in parallel with the first switching element S1. Therefore, the voltage at the first end of the choke coil L rises by the voltage Vf corresponding to the voltage drop with respect to the voltage Va on the primary side of the DC-DC converter 14. As described above, in a case where the voltage difference between the voltage Va on the primary side of the DC-DC converter 14 and the voltage Vb of the second power storage device 16 is within the range of the voltage Vf corresponding to the voltage drop due to the first diode D1, the current flowing out from the second power storage device 16 can be controlled by the second switching element S2.

According to the power supply system 10 according to the present embodiment, in a state in which the first switching element S1 is turned off, in a case where the current flowing out from the second power storage device 16 cannot be controlled even though the ON time of the second switching element S2 is controlled to become zero and the actual current Ib that flows out exceeds the reference current, the controller 17 further turns off the third switching element S3 (OFF).

By turning off the third switching element S3, a voltage drop occurs due to the third diode D3 connected in parallel with the third switching element S3. As a result, the voltage Vb of the second power storage device 16 rises by the voltage corresponding to the voltage drop with respect to the voltage of the second end of the choke coil L. As described above, in a case where the voltage difference between the voltage Va on the primary side of the DC-DC converter 14 and the voltage Vb of the second power storage device 16 is also within the range of the voltage Vf corresponding to the voltage drop due to the third diode D3, the current flowing out from the second power storage device 16 can be controlled by the second switching element S2.

According to the power supply system 10 according to the present embodiment, in a state in which the first switching element S1 and the third switching element S3 are turned off, in a case where the current flowing out from the second power storage device 16 cannot be controlled even though the ON time of the second switching element S2 is controlled to become zero and the actual current Ib that flows out exceeds the reference current, the controller 17 further turns off the second switching element S2 and the fourth switching element S4. As described above, it is possible to suppress a situation in which a current flows out continuously from the second power storage device 16 to the first power storage device 12 side to cause overdischarge of the second power storage device 16.

Application Examples

Figure 5:
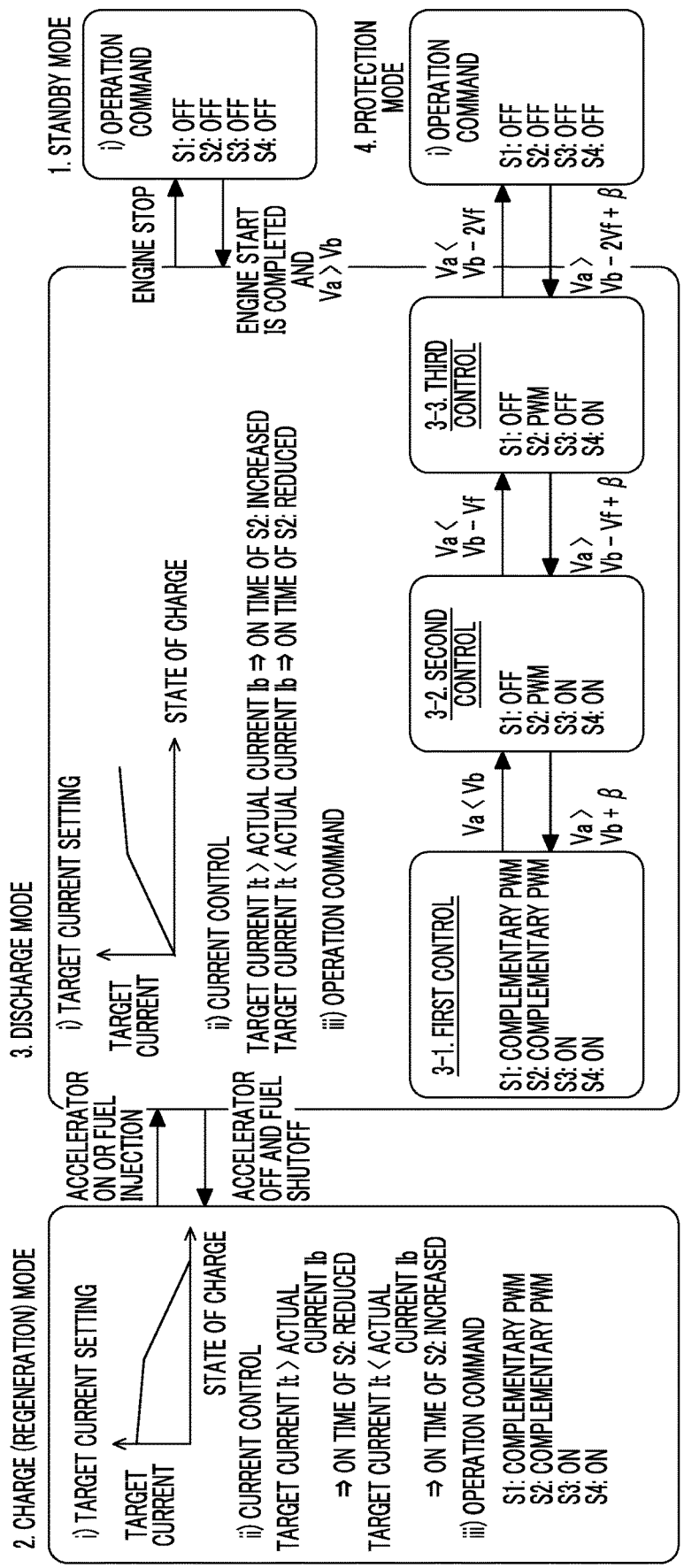
FIG. 5 is a state transition diagram according to an application example of the power supply system according to the embodiment of the disclosure.

FIG. 5 is a state transition diagram according to an application example of the power supply system 10 according to the embodiment of the disclosure. In the state transition diagram shown in FIG. 5, the method of determining the transition from the first control to the second control in the discharge mode, the transition from the second control to the third control, and the transition from the discharge mode to the protection mode by the third control is different from that in the state transition diagram of FIG. 2 described above.

Figure 6:
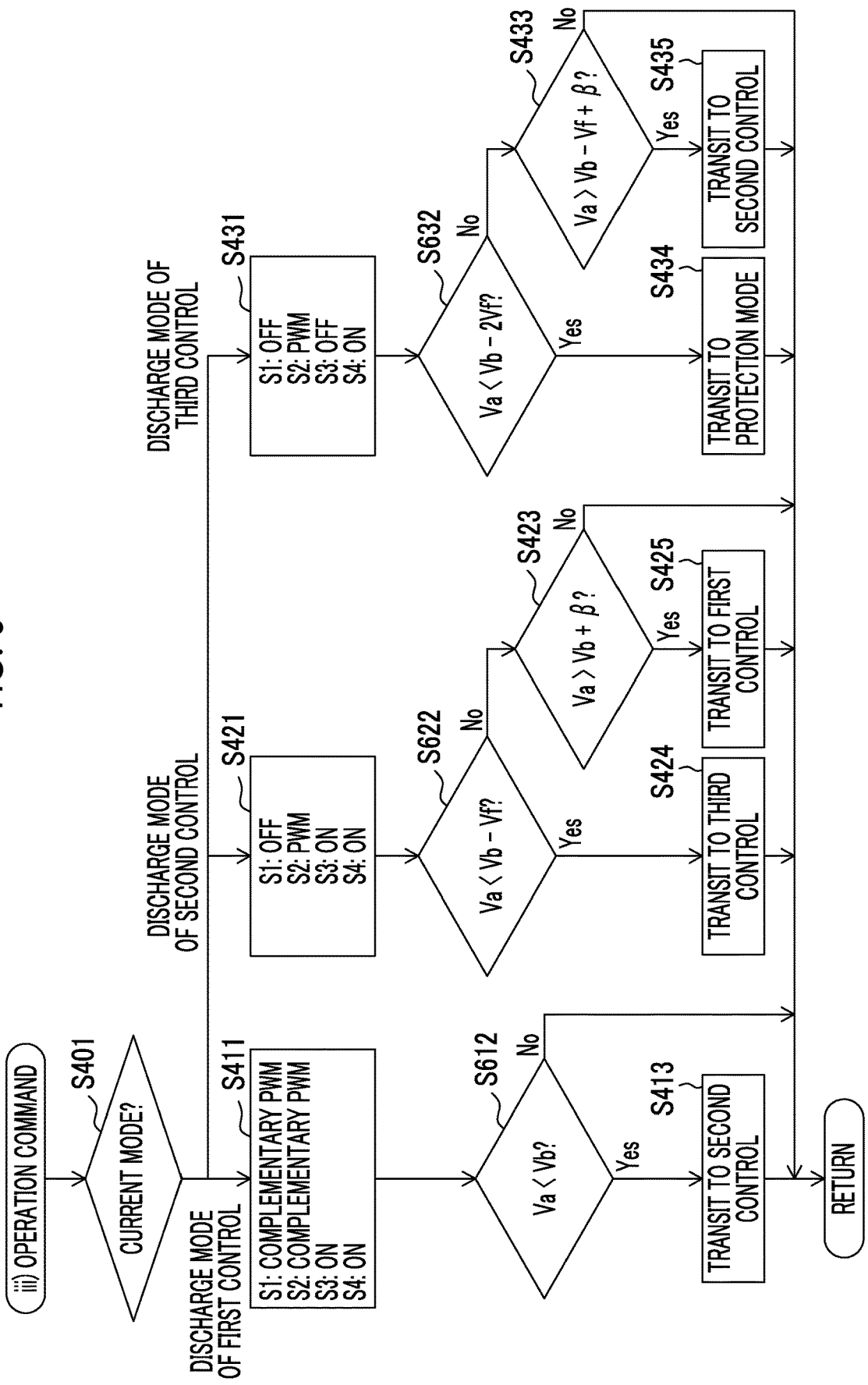
FIG. 6 is a flowchart of power supply control processing performed by a controller of the power supply system of the application example.

In the state transition diagram of FIG. 2, the actual current Ib that actually flows out from the second power storage device 16 is determined. However, in the state transition diagram according to the application example of FIG. 5, the voltage Va on the primary side of the DC-DC converter 14 is determined. Specifically, in the first control of the discharge mode, in a case where the voltage Va on the primary side of the DC-DC converter 14 becomes lower than the voltage Vb of the second power storage device 16 (Va<Vb), the control in the discharge mode transitions from the first control to the second control. In the second control of the discharge mode, in a case where the voltage Va on the primary side of the DC-DC converter 14 becomes lower than a value (first voltage) obtained by subtracting the voltage Vf corresponding to the voltage drop from the voltage Vb of the second power storage device 16 (Va<Vb−Vf), the control in the discharge mode transitions from the second control to the third control. In the third control of the discharge mode, in a case where the voltage Va on the primary side of the DC-DC converter 14 becomes lower than a value (second voltage) obtained by subtracting twice the voltage Vf corresponding to the voltage drop from the voltage Vb of the second power storage device 16 (Va<Vb−2Vf), the state transitions from the discharge mode to the protection mode. The above control can be realized through the processing of steps S612, S622, and S632 as shown in the flowchart of FIG. 6.

Modification Examples

Figure 7:
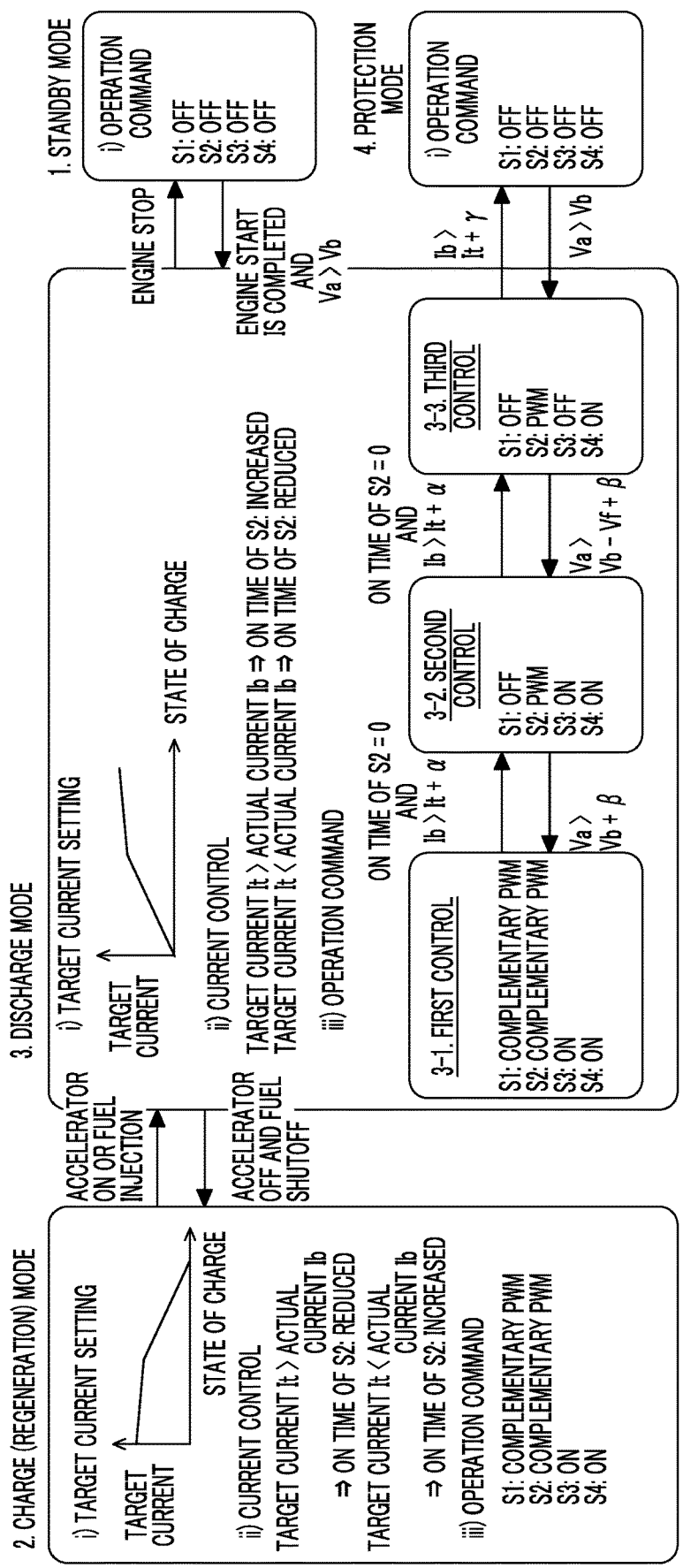
FIG. 7 is a state transition diagram according to a modification example of the power supply system according to the embodiment of the disclosure.

FIG. 7 is a state transition diagram according to a modification example of the power supply system 10 according to the embodiment of the disclosure. In the state transition diagram shown in FIG. 7, the method of determining the transition from the discharge mode to the protection mode is different from that in the state transition diagram of FIG. 2 described above.

Figure 8:
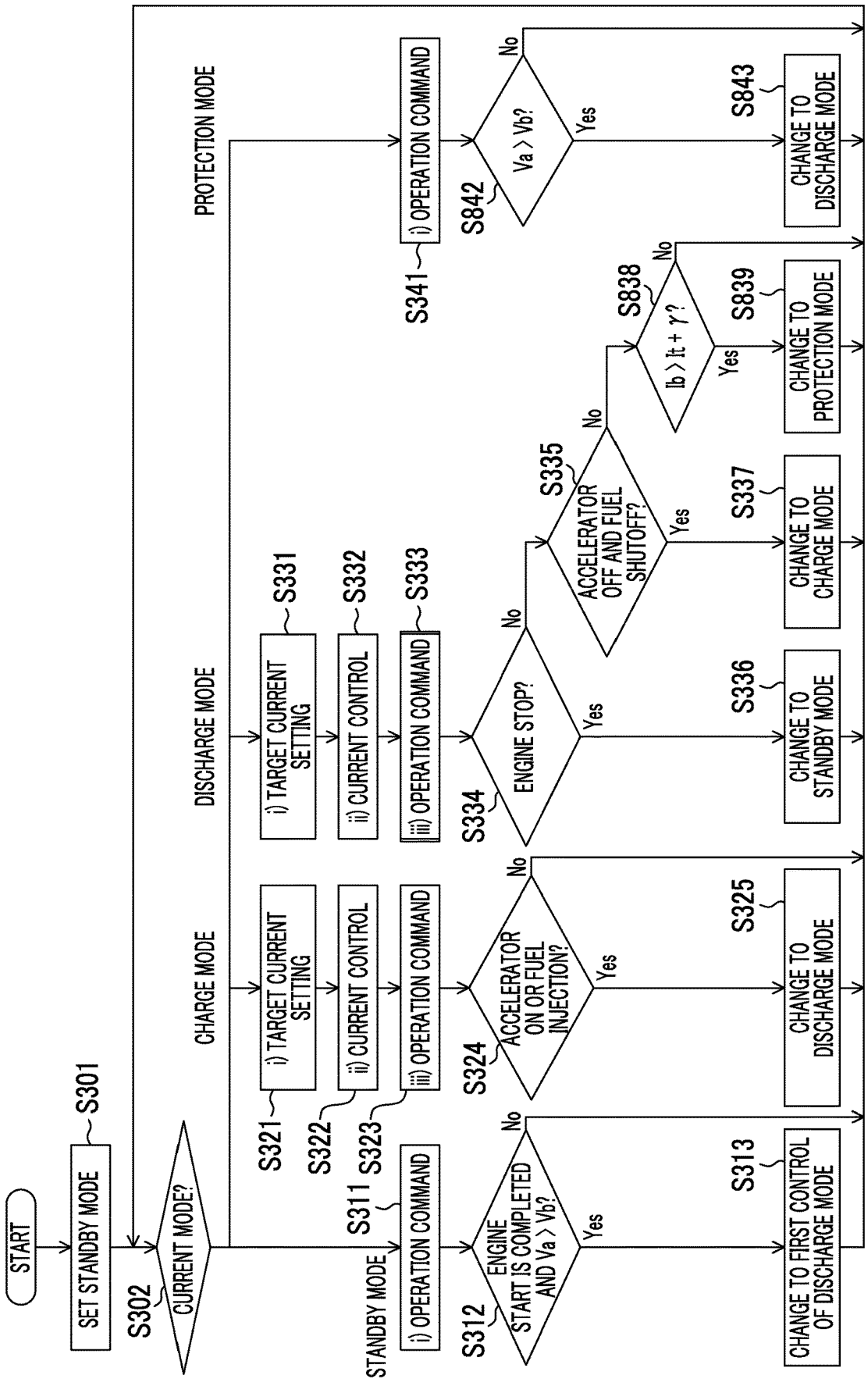
FIG. 8 is a flowchart of power supply control processing performed by a controller of the power supply system of the modification example.
Figure 9:
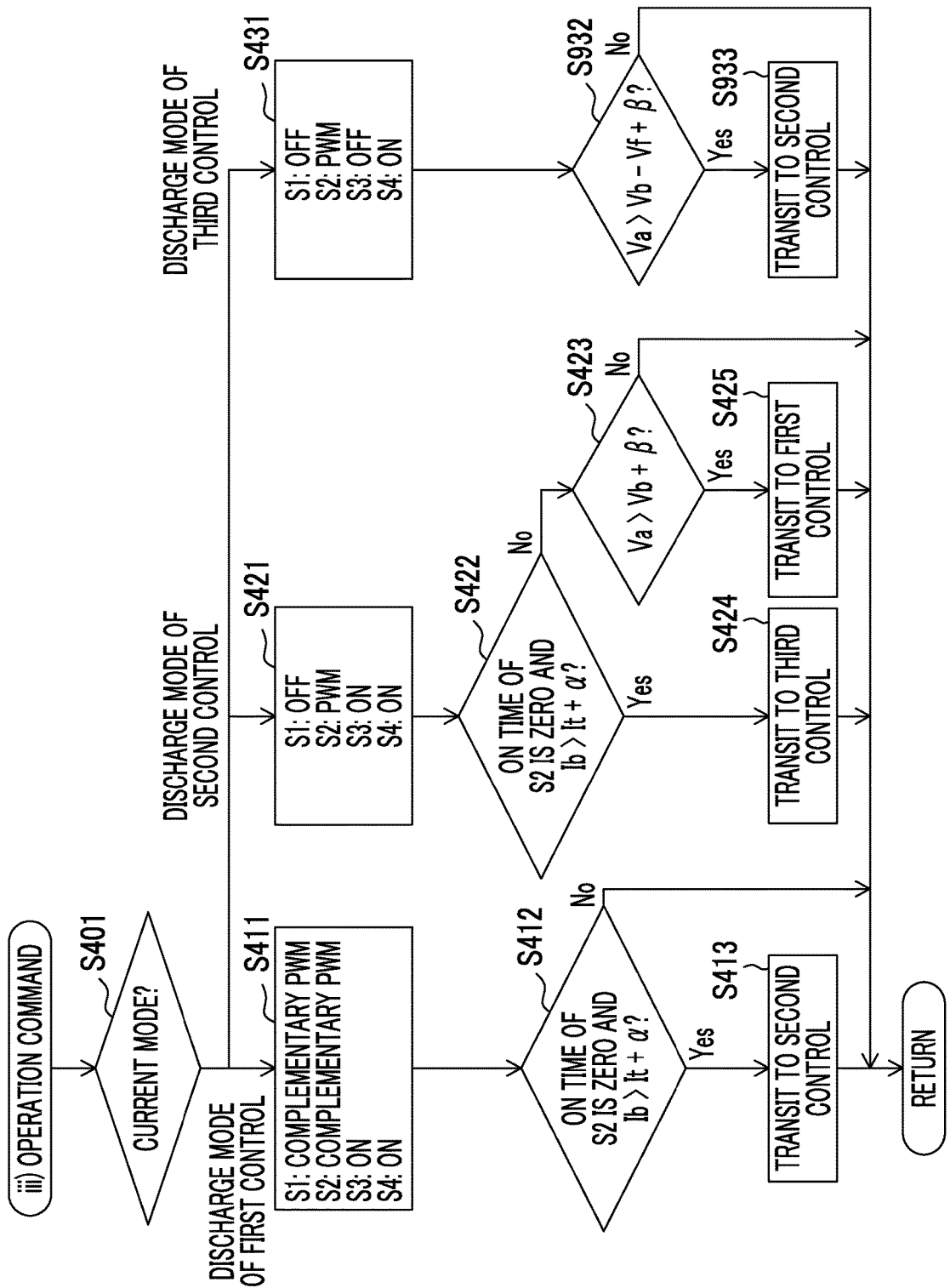
FIG. 9 is a flowchart of power supply control processing performed by the controller of the power supply system of the modification example.

In the state transition diagram of FIG. 2, the state in which transition to the protection mode is possible is limited to the discharge mode by the third control. However, in the state transition diagram according to the application example of FIG. 7, transition from any control state of the discharge mode to the protection mode is possible, and transition from the protection mode to any control state of the discharge mode is also possible. Specifically, in the discharge mode, in a case where the actual current Ib flowing out from the second power storage device 16 exceeds a value obtained by adding a predetermined value γ to the target current It (Ib>It+γ), the state transitions from the discharge mode to the protection mode. In the protection mode, in a case where the voltage Va on the primary side of the DC-DC converter 14 exceeds the voltage Vb of the second power storage device 16 (Va>Vb), the state transitions from the protection mode to any control of the discharge mode. The above control can be realized through the processing of steps S838, S839, S842, S843, S932, and S933 as shown in the flowcharts of FIGS. 8 and 9. The predetermined value γ can be freely set to suppress the chattering of the transition control.

In the embodiment described above, in a case where the current flowing out from the second power storage device 16 cannot be controlled even though the ON time of the second switching element S2 is controlled to become zero and the actual current Ib that flows out exceeds the reference current "target current It+predetermined value α" or the voltage Va on the primary side of the DC-DC converter 14 becomes lower than the voltage Vb of the second power storage device 16, the controller 17 turns off the first switching element S1 and the third switching element S3 (OFF). However, the duty ratio between the ON time of the first switching element S1 and the ON time of the third switching element S3 may be reduced.

The power supply system of the disclosure can be used for a vehicle in which a power storage device for regeneration and a DC-DC converter are mounted.

What is claimed is:
1. A power supply system comprising:
a first power storage device;
a second power storage device having a lower voltage than the first power storage device;
a DC-DC converter including a choke coil, a first switching element configured to switch a connection state between a first end of the choke coil and the first power storage device, a first diode that is connected in parallel with the first switching element and that rectifies a current flowing from the choke coil side to the first power storage device side, and a second switching element configured to switch a ground state of the first end of the choke coil;
a semiconductor relay configured to switch a connection state between a second end of the choke coil and the second power storage device; and
a controller configured to enable switching between a first control in which the first switching element and the second switching element perform a switching operation by complementary PWM control and a second control in which the first switching element is turned off and the second switching element performs a switching operation by PWM control, and to switch from the first control to the second control when an ON time of the second switching element is controlled to become zero and a current flowing out from the second power storage device exceeds a first reference current.

2. The power supply system according to claim 1, wherein the controller is configured to turn off the first switching element when the ON time of the second switching element is controlled to become zero and the current flowing out from the second power storage device exceeds the first reference current.

3. The power supply system according to claim 2, wherein:
   the semiconductor relay includes a third switching element and a fourth switching element connected in series to each other, a third diode that is connected in parallel with the third switching element and that rectifies a current flowing from the fourth switching element side to the choke coil side, and a fourth diode that is connected in parallel with the fourth switching element and that rectifies a current flowing from the third switching element side to the second power storage device side; and
   the controller is configured to reduce a duty ratio of an ON time of the third switching element when the ON time of the second switching element is controlled to become zero in a state in which the first switching element is turned off and the current flowing out from the second power storage device exceeds a second reference current.

4. The power supply system according to claim 3, wherein the controller is configured to turn off the third switching element when the ON time of the second switching element is controlled to become zero in a state in which the first switching element is turned off and the current flowing out from the second power storage device exceeds the second reference current.

5. The power supply system according to claim 4, wherein the controller is configured to further turn off the second switching element and the fourth switching element when the ON time of the second switching element is controlled to become zero and the current flowing out from the second power storage device exceeds a third reference current.

6. The power supply system according to claim 5, wherein each of the first reference current to the third reference current is a value obtained by adding a predetermined value to a target current determined based on a state of charge of the second power storage device.

7. The power supply system according to claim 3, wherein the controller is configured to turn off the first switching element, the second switching element, the third switching element, and the fourth switching element when the current flowing out from the second power storage device exceeds a third reference current.

8. The power supply system according to claim 7, wherein the fourth reference current is a value obtained by adding a predetermined value set to suppress chattering to a target current determined based on a state of charge of the second power storage device.

9. A power supply system comprising:
   a first power storage device;
   a second power storage device having a lower voltage than the first power storage device;
   a DC-DC converter including a choke coil, a first switching element configured to switch a connection state between a first end of the choke coil and the first power storage device, a first diode that is connected in parallel with the first switching element and that rectifies a current flowing from the choke coil side to the first power storage device side, and a second switching element configured to switch a ground state of the first end of the choke coil;
   a semiconductor relay configured to switch a connection state between a second end of the choke coil and the second power storage device; and
   a controller configured to enable switching between a first control in which the first switching element and the second switching element perform a switching operation by complementary PWM control and a second control in which the first switching element is turned off and the second switching element performs a switching operation by PWM control, and to switch from the first control to the second control when a voltage on the first power storage device side becomes lower than a voltage of the second power storage device.

10. The power supply system according to claim 9, wherein the controller is configured to turn off the first switching element when the voltage on the first power storage device side becomes lower than the voltage of the second power storage device.

11. The power supply system according to claim 10, wherein:
   the semiconductor relay includes a third switching element and a fourth switching element connected in series to each other, a third diode that is connected in parallel with the third switching element and that rectifies a current flowing from the fourth switching element side to the choke coil side, and a fourth diode that is connected in parallel with the fourth switching element and that rectifies a current flowing from the third switching element side to the second power storage device side; and
   the controller is configured to reduce a duty ratio of an ON time of the third switching element when the voltage on the first power storage device side becomes lower than a first voltage, which is lower than the voltage of the second power storage device by a predetermined value, in a state in which the first switching element is turned off.

12. The power supply system according to claim 11, wherein the controller is configured to turn off the third switching element when the voltage on the first power storage device side becomes lower than the first voltage, which is lower than the voltage of the second power storage device by the predetermined value, in a state in which the first switching element is turned off.

13. The power supply system according to claim 12, wherein the controller is configured to further turn off the second switching element and the fourth switching element when the voltage on the first power storage device side becomes lower than a second voltage that is lower than the voltage of the second power storage device by a predetermined value.

14. The power supply system according to claim 12, wherein the predetermined value is set based on a drop voltage of the first diode and the third diode.

* * * * *